United States Patent
Zhang (10) Patent No.: US 11,870,357 B2
(45) Date of Patent: *Jan. 9, 2024

(54) DC-DC CONVERTER, ON-BOARD CHARGER, AND ELECTRIC VEHICLE

(71) Applicant: BYD COMPANY LIMITED, Guangdong (CN)

(72) Inventor: Xiaobin Zhang, Shenzhen (CN)

(73) Assignee: BYD COMPANY LIMITED, Guangdong (CN)

(*) Notice: Subject to any disclaimer, the term of this patent is extended or adjusted under 35 U.S.C. 154(b) by 607 days.

This patent is subject to a terminal disclaimer.

(21) Appl. No.: 17/050,166

(22) PCT Filed: Apr. 25, 2019

(86) PCT No.: PCT/CN2019/084328
§ 371 (c)(1),
(2) Date: Oct. 23, 2020

(87) PCT Pub. No.: WO2019/206230
PCT Pub. Date: Oct. 31, 2019

(65) Prior Publication Data
US 2021/0099097 A1   Apr. 1, 2021

(30) Foreign Application Priority Data
Apr. 26, 2018   (CN) .......................... 201810385200.1

(51) Int. Cl.
*H02M 3/335*   (2006.01)
*H02J 7/00*   (2006.01)
(Continued)

(52) U.S. Cl.
CPC ........ *H02M 3/33584* (2013.01); *G01R 15/18* (2013.01); *G01R 19/25* (2013.01);
(Continued)

(58) Field of Classification Search
CPC ......... H02M 3/33584; H02M 3/33592; H02M 1/42; H02M 1/0009; H02J 7/007; H02J 2207/20; G01R 15/18; G01R 19/25
(Continued)

(56) References Cited

U.S. PATENT DOCUMENTS 5,388,040 A * 2/1995 Hall .......................... H02J 7/02
363/16
9,821,670 B2 * 11/2017 Biagini ............... H02M 1/4225
(Continued)

FOREIGN PATENT DOCUMENTS

| AU | 6312073 A | 3/1974 |
|---|---|---|
| CN | 202218161 U | 5/2012 |

(Continued)

OTHER PUBLICATIONS

PCT International Search Report, PCT/CN2019/084328, dated Jul. 4, 2019, 4 Pages.

*Primary Examiner* — Edward Tso
*Assistant Examiner* — Aaron Piggush (57) ABSTRACT

A DC-DC converter, an on-board charger, and an electric vehicle are disclosed. The DC-DC converter includes: a first adjustment module, a resonance module, a second adjustment module, a current detection module, and a controller. The current detection module is configured to detect a current signal of the resonance module; and the controller is configured to control the first adjustment module and the second adjustment module to reduce an output power when the current signal is greater than a current threshold. By directly detecting the current signal of the resonance module, a high precision and a faster response are achieved.

4 Claims, 5 Drawing Sheets

(51) Int. Cl.
  *G01R 15/18*  (2006.01)
  *G01R 19/25*  (2006.01)
  *H02M 1/42*  (2007.01)
  *H02M 1/00*  (2006.01)

(52) U.S. Cl.
  CPC .............. *H02J 7/007* (2013.01); *H02M 1/42* (2013.01); *H02M 3/33592* (2013.01); *H02J 2207/20* (2020.01); *H02M 1/0009* (2021.05)

(58) Field of Classification Search
  USPC .......................... 320/104, 108, 109, 140, 157
  See application file for complete search history.

(56) References Cited

U.S. PATENT DOCUMENTS

| | | | |
|---|---|---|---|
| 11,404,965 B2* | 8/2022 | Zhang | H02M 3/01 |
| 2005/0152159 A1 | 7/2005 | Isurin et al. | |
| 2013/0314038 A1* | 11/2013 | Kardolus | B60L 53/20 320/109 |
| 2015/0180350 A1* | 6/2015 | Huang | H02M 3/33584 307/66 |
| 2016/0006346 A1 | 1/2016 | Satoh et al. | |
| 2016/0049882 A1 | 2/2016 | Chen et al. | |
| 2019/0097543 A1* | 3/2019 | Achtzehn | H02M 3/33584 |

FOREIGN PATENT DOCUMENTS

| | | |
|---|---|---|
| CN | 103683964 A | 3/2014 |
| CN | 104506039 A | 4/2015 |
| CN | 204810140 U | 11/2015 |
| CN | 105871215 A | 8/2016 |
| CN | 106411162 A | 2/2017 |
| CN | 107017816 A | 8/2017 |
| CN | 107517006 A | 12/2017 |
| CN | 107757388 A | 3/2018 |
| CN | 107994149 A | 5/2018 |
| CN | 108321314 A | 7/2018 |
| CN | 208797084 A | 4/2019 |
| CN | 110165116 A | 8/2019 |
| CN | 209561492 U | 10/2019 |
| CN | 113738913 A | 12/2021 |
| CN | 113738914 A | 12/2021 |
| CN | 113738916 A | 12/2021 |
| DE | 102016006549 A1 | 11/2017 |
| JP | 2000-245147 A | 9/2000 |
| JP | 2001-103741 A | 4/2001 |
| JP | 2012043758 A | 3/2012 |
| JP | 2014-079145 A | 5/2014 |
| JP | 2014-171313 A | 9/2014 |
| JP | 2016-012970 A | 1/2016 |
| JP | 2016-149834 A | 8/2016 |
| WO | 9911956 A1 | 3/1999 |
| WO | 2014/192290 A1 | 2/2017 |
| WO | 2015/079572 A1 | 3/2017 |

* cited by examiner

DC-DC CONVERTER, ON-BOARD CHARGER, AND ELECTRIC VEHICLE

CROSS-REFERENCE TO RELATED APPLICATIONS

This application is the National Stage of International Application No. PCT/CN2019/084328, "DCDC Converter, Vehicle-Mounted Charger and Electric Vehicle," filed on Apr. 25, 2019; which claims priority to Chinese patent application No. 201810385200.1 filed on Apr. 26, 2018. The entire content of both of the above-referenced applications are incorporated herein by reference.

FIELD

The present disclosure relates to the field of vehicle technologies, and in particular, to a DC-DC converter, an on-board charger including the DC-DC converter, and an electric vehicle mounted with the on-board charger.

BACKGROUND

With the continuous development of electric vehicles, battery modules of the electric vehicles have increasingly high capacities. To reduce a charging/discharging time, a high-capacity battery module requires a higher-power bidirectional on-board charger (hereinafter referred to as an on-board charger). Currently, a power level of a mainstream on-board charger in the industry is single-phase 3.3 KW/6.6 KW. With further requirements for high-power on-board chargers, three-phase 10/20/40 KW on-board chargers have a growing market.

A main power topology of the on-board charger generally includes two parts, that is, power factor correction (PFC)+bidirectional DC-DC, and the PFC plays a role of correcting a power factor. The bidirectional DC-DC implements controllable isolated transmission of energy, and is a core power conversion unit of the on-board charger. To meet requirements of high-power charging and discharging, a high-power bidirectional DC-DC converter generally uses a multi-module parallel connection. However, the multi-module parallel connection has some problems, and therefore has high requirements on a system hardware circuit design and a software algorithm.

SUMMARY

An objective of the present disclosure is to resolve one of technical problems in the related art at least to some extent.

Based on this, an embodiment of the present disclosure provides a DC-DC converter, which is more suitable for a high-power on-board charger, and has low costs and a simple structure.

Another embodiment of the present disclosure provides an on-board charger including the DC-DC converter.

Still another embodiment of the present disclosure provides an electric vehicle mounted with the on-board charger.

To achieve the objective, the DC-DC converter according to the embodiment of a first aspect of the present disclosure includes: a first adjustment module, a resonance module, a second adjustment module, a current detection module and a controller, where the first adjustment module is configured to: adjust frequency of an input signal of the DC-DC converter when a battery module of a vehicle is charged by the external, or rectify an output signal of the resonance module when the battery module is discharged by the external; the resonance module is configured to: resonate an output signal of the first adjustment module when the battery module of the vehicle is charged by the external, or resonate an output signal of the second adjustment module when the battery module is discharged by the external; the second adjustment module is configured to: adjust frequency of an output signal of the battery module when the battery module of the vehicle is discharged by the external, or rectify the output signal of the resonance module when the battery module is charged by the external; the current detection module is configured to detect a current signal of the resonance module; and the controller, separately connected to a control end of the first adjustment module and a control end of the second adjustment module, is configured to control the first adjustment module and the second adjustment module when the current signal is greater than a current threshold, to reduce an output power.

According to the DC-DC converter of the embodiment of the present disclosure, compared with a common three-phase interleaved LLC resonant converter, the resonance module may resonate bidirectionally, implementing bidirectional energy transmission, and has a smaller output ripple current. Compared with a multi-module parallel connection mode, fewer devices are used, resulting in low costs. Compared with output current feedback, direct acquisition of the current signal of the resonance module by the current detection module has a higher acquisition precision, and a faster response, so that the current of the resonance module may be more effectively monitored, and when the current signal exceeds a limit, the output power is reduced, thereby avoiding damage caused by overloading.

To achieve the objective, the on-board charger according to the embodiment of a second aspect of the present disclosure includes: a three-phase PFC circuit and the DC-DC converter.

According to the embodiment of the present disclosure, by adopting the DC-DC converter according to the embodiment of the foregoing aspect, the on-board charger can implement high-power charging and discharging, has a small output ripple current, and a fast response and reliable overcurrent protection function.

To achieve the objective, the electric vehicle according to the embodiment of a third aspect of the present disclosure includes the on-board charger.

According to the embodiment of the present disclosure, by mounting the on-board charger 1000 according to the embodiment of the foregoing aspect, the electric vehicle can implement high-power charging and discharging, and has a small output ripple current, and a fast response and reliable overcurrent protection function.

DETAILED DESCRIPTION

The embodiments of the present disclosure are described below in detail. Examples of the embodiments are shown in the accompanying drawings, and same or similar reference signs in all the accompanying drawings indicate same or similar components or components having same or similar functions. The embodiments described below with reference to the accompanying drawings are exemplary, and are intended to explain the present disclosure and cannot be understood as a limitation to the present disclosure.

Figure 1:
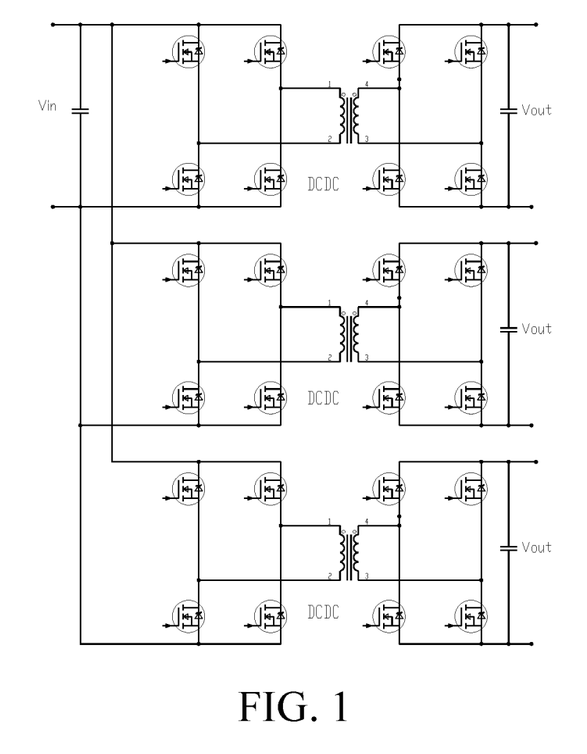
FIG. 1 is a schematic diagram of a circuit topology of a three-module parallel bidirectional DC-DC converter in the related art.

The embodiments of the present disclosure are based on understanding and research of the inventors on the following problems:

FIG. 1 is a schematic circuit diagram of a typical multi-module parallel bidirectional DC-DC converter. More modules connected in parallel are deduced by analogy. For some problems existing in the solution shown in FIG. 1, for example, high costs due to a large quantity of devices, each module requires an independent voltage, current sampling, and a drive control circuit, resulting in large redundancy, and it is difficult to optimize costs and a volume. In another example, it is still difficult to resolve a large output ripple current. To reduce a ripple current, each module still requires a larger filter capacitor. Certainly, a plurality of independent modules are subjected to phase interleaving to reduce the ripple current, but different modules are required to work cooperatively. A master and a slave are required to be provided, and there is a high coordination requirement. This proposes high requirements on both a system hardware circuit design and a software algorithm.

The DC-DC converter according to an embodiment of the present disclosure is described with reference to the accompanying drawings.

In the related art, to meet requirements of high-power charging and discharging, for defects using the multi-module parallel connection mode shown in FIG. 1, the embodiment of the present disclosure provides a novel three-phase interleaved resonance bidirectional DC-DC converter.

Figure 2:
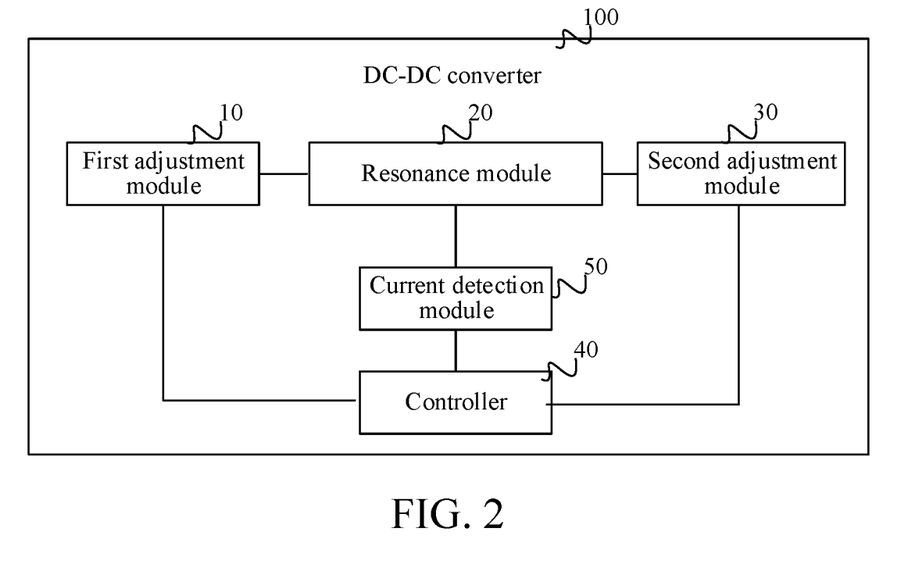
FIG. 2 is a block diagram of a DC-DC conversion module according to an embodiment of the present disclosure.
Figure 3:
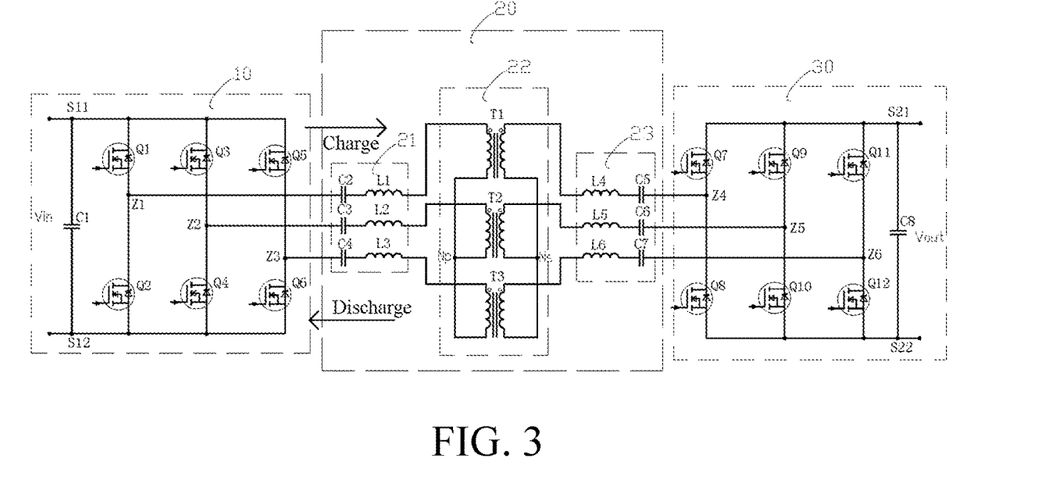
FIG. 3 is a schematic diagram of a circuit topology of a DC-DC converter according to an embodiment of the present disclosure.

FIG. 2 is a block diagram of a DC-DC converter according to an embodiment of the present disclosure. As shown in FIG. 3, the DC-DC converter 100 according to the embodiment of the present disclosure includes a first adjustment module 10, a resonance module 20, a second adjustment module 30, a controller 40, and a current detection module 50.

The first adjustment module 10 is configured to: adjust frequency of an input signal of the DC-DC converter 100 when a battery module of a vehicle is charged by the external, to adjust impedance of the resonance module 20, where the external may be a power grid or another power supply device. For example, the power grid charges the battery module. Alternatively, when the battery module is discharged by the external, where the external may be an electric load, for example, the battery module is discharged by the electric load, the first adjustment module 10 is configured to rectify and filter an output signal of the resonance module 20 for a back-end load. The battery module may be a power battery, and the external may be a device, an apparatus, or the like that can charge and discharge the battery module. This is not specifically limited in this embodiment of the present disclosure.

The resonance module 20 is configured to: resonate an output signal of the first adjustment module 10 when the battery module of the vehicle is charged by the external, to generate a high-frequency resonant current, or resonate an output signal of the second adjustment module 30 when the battery module is discharged by the external, to generate a high-frequency resonant current.

The second adjustment module 30 is configured to: adjust frequency of an output signal of the battery module when the battery module of the vehicle is discharged by the external, to adjust the impedance of the resonance module 20, or rectify the output signal of the resonance module 20 when the battery module is charged by the external, to convert the high-frequency resonant current into a direct current to be provided for the battery module, thereby implementing charging of the battery module.

The current detection module 50 is configured to: detect a current signal of the resonance module 20, that is, directly detect the current of the resonance module 20, and feed the current signal back to the controller 40.

In the embodiment of the present disclosure, the resonance module 20 may include N primary LC units, an N-phase voltage transformation unit, and N secondary LC units. N is an integer greater than 1. For example, N may be 2, 3, 4 or the like. For ease of describing the present disclosure, in the following embodiments, all description is made by using an example in which N is equal to 3.

As shown in FIG. 3, the resonance module 20 includes three primary LC units 21, a three-phase voltage transformation unit 22, and three secondary LC units 23.

In the embodiment of the present disclosure, when the battery module is charged by the external, the three primary LC units 21 and the three-phase voltage transformation unit 22 are configured to resonate the output signal of the first adjustment module 10 to generate a high-frequency current. Further, the high-frequency current is converted into a direct current after being rectified and filtered by the second adjustment module 30, and the direct current may be provided for the battery module of the vehicle, thereby implementing charging of the battery module. When the battery module is discharged by the external, the three secondary LC units 23 and the three-phase voltage transformation unit 22 are configured to resonate the output signal of the second adjustment module 30 to generate the high-frequency current. The high-frequency current is converted into a direct current after being rectified and filtered by the first adjustment module 10, and the direct current may be provided for a subsequent component for processing, so as to supply power to the load, thereby implementing discharging of the battery module of the vehicle.

In some embodiments of the present disclosure, as shown in FIG. 3, the first adjustment module 10 includes a first three-phase bridge circuit, and the second adjustment module 30 includes a second three-phase bridge circuit, where one end of each primary LC unit 21 is connected to a phase line connection point of a corresponding phase bridge arm in the first three-phase bridge circuit 10, dotted terminals of primary coils of the three-phase voltage transformation unit 22 are separately connected to the other ends of the corresponding primary LC units 21, and undotted terminals of the primary coils of the three-phase voltage transformation unit 22 are connected together, to form a Y-type connection. Dotted terminals of secondary coils of the three-phase voltage transformation unit 22 are separately connected to one ends of the corresponding secondary LC units 23, and undotted terminals of the secondary coils of the three-phase voltage transformation unit 22 are connected together, to form a Y-type connection. The Y-type connection helps the three-phase bridge circuit implement automatic current sharing, thereby avoiding uneven power distribution caused by a device parameter deviation of the three-phase bridge circuit.

A phase line connection point of each phase bridge arm of the second three-phase bridge circuit 30 is connected to the other ends of the corresponding secondary LC units 23.

The controller 40 is separately connected to a control end of a switch tube of the first three-phase bridge circuit 10 and a control end of a switch tube of the second three-phase bridge circuit 30, and is configured to control the switch tubes of the first three-phase bridge circuit 10 and the second three-phase bridge circuit 30 according to charging and discharging signals.

In the embodiment of the present disclosure, the three-phase voltage transformation unit 22 may be wound with three independent magnetic cores or the same magnetic core.

In this embodiment, when the battery module is charged by the external, each primary LC unit 21 and the primary coils of the corresponding voltage transformation unit 22 may form a resonant cavity of a corresponding input. The controller 40 performs high-frequency resonance control on the first three-phase bridge circuit 10 and rectification control on the second three-phase bridge circuit 30. The first three-phase bridge circuit 10, the three primary LC units 21, and the primary coils of the three-phase voltage transformation unit 22 form a three-phase interleaved LLC that works in a high-frequency resonant state and outputs a high-frequency current. The high-frequency current is converted into a direct current after being rectified by using the second three-phase bridge circuit 30, and the direct current may charge the battery module of the whole electric vehicle.

When the battery module is discharged by the external, each secondary LC unit 23 and the secondary coils of the corresponding voltage transformation unit 22 may form a resonant cavity of a corresponding input, the controller 40 performs high-frequency resonant control on the second three-phase bridge circuit 30 and rectification control on the first three-phase bridge circuit 10. The second three-phase bridge circuit 10, the three secondary LC units 23, and the secondary coils of the three-phase voltage transformation unit 22 form a three-phase interleaved LLC resonant converter that works in a high-frequency resonant state and outputs a high-frequency current. The high-frequency current is converted into a direct current after being rectified by using the first three-phase bridge circuit 10, thereby implementing discharging of the battery module.

Figure 4:
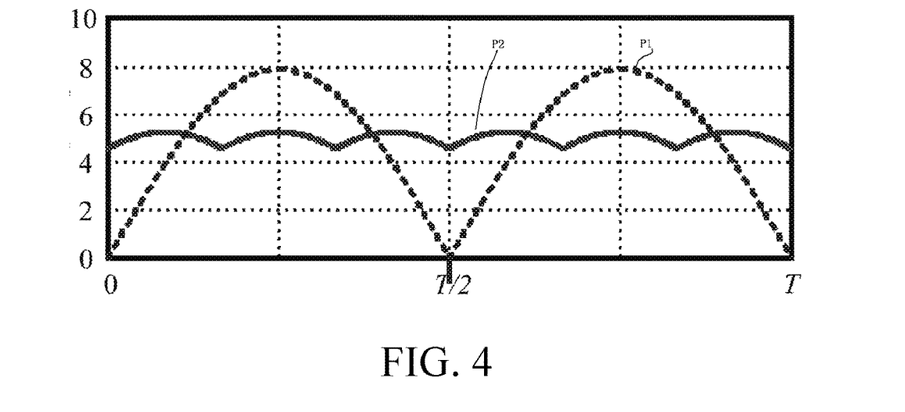
FIG. 4 is a schematic diagram of a waveform of an output ripple current of a DC-DC converter according to an embodiment of the present disclosure.

Based on the DC-DC converter 100 of the embodiment of the present disclosure, an output ripple current is small. As shown in FIG. 4, P1 is a curve of an output ripple current of a common full-bridge circuit, and P2 is a curve of an output ripple current of the structure of the present application. Compared with the common full-bridge circuit, under the condition of the same output current $I_0$, the output ripple current of the common full-bridge circuit is $I_{ripple}=\pi I_0/2=1.57I_0$, while the output ripple current of the circuit based on the present application is $I_{ripple}=(2-\sqrt{3})I_0/2=0.14I_0$. Obviously, the output ripple current of the circuit in the present application is smaller, and the smaller ripple current helps reduce output filter capacitors.

According to the DC-DC converter 100 of the embodiment of the present disclosure, compared with the common three-phase interleaved LLC resonant converter, a resonant unit is added to a secondary side of the voltage transformation unit, to achieve bidirectional resonance and implement bidirectional energy transmission. In addition, the power distribution is uniform, the output ripple current is smaller, and the costs are low due to fewer devices.

However, the DC-DC converter described above still has some defects. For example, although the three-phase voltage transformation unit may implement natural current-sharing through the Y-type connection, if the three-phase bridge has a large resonance parameter deviation, resonance parameters of three resonant cavities deviate, which eventually results in the unbalanced power of the three-phase bridge. Because of characteristics of the LLC circuit, the resonant cavity has a large resonant current when a system is started, and it is difficult to effectively monitor the current of the resonant cavity by using a conventional output-current-feedback-based startup control policy. If feedback parameters are not matched well, the resonant cavity has a large impact current in the starting process, which affects a service life of a product and even damages the product earlier than expected.

For the problems above, the embodiment of the present disclosure is further improved. As shown in FIG. 2, the DC-DC converter 100 of the embodiment of the present disclosure directly detects the current signal of the resonance module 20 by using the current detection module 50. That is, the current flowing through each phase is separately detected, and the current signal is fed back to the controller 40. Compared with the conventional output current feedback, direct acquisition of the current signal of the resonance module 20 achieves a high precision and a faster feedback response. The controller 40, connected to a control end of the first adjustment module 10 and also connected to a control end of the second adjustment module 30, is configured to control the first adjustment module 10 and the second adjustment module 30 when the current signal is greater than a current threshold, to reduce an output power, so as to reduce the output power of the system, and reduce a working current of the system to avoid overloading that damages the three-phase bridge circuit.

According to the DC-DC converter 100 of the embodiment of the present disclosure, compared with output current feedback, direct acquisition of the current signal of the resonance module 20 by the current detection module 50 has a higher acquisition precision, and a faster response, so that the current of the resonance module 20 may be more effectively monitored, and when the current signal exceeds a limit, the output power is reduced, thereby avoiding damage caused by overloading.

The units and connection relationships thereof in the present disclosure are further described below with reference to the accompanying drawings. In the first three-phase bridge circuit 10 and the second three-phase bridge circuit 30, a three-phase bridge structure may be formed by switch tubes such as MOS transistor or insulated gate bipolar transistors (IGBTs) or other elements. The LC unit may include capacitors and inductors. The voltage transformation unit may be implemented by a transformer structure.

Figure 5:
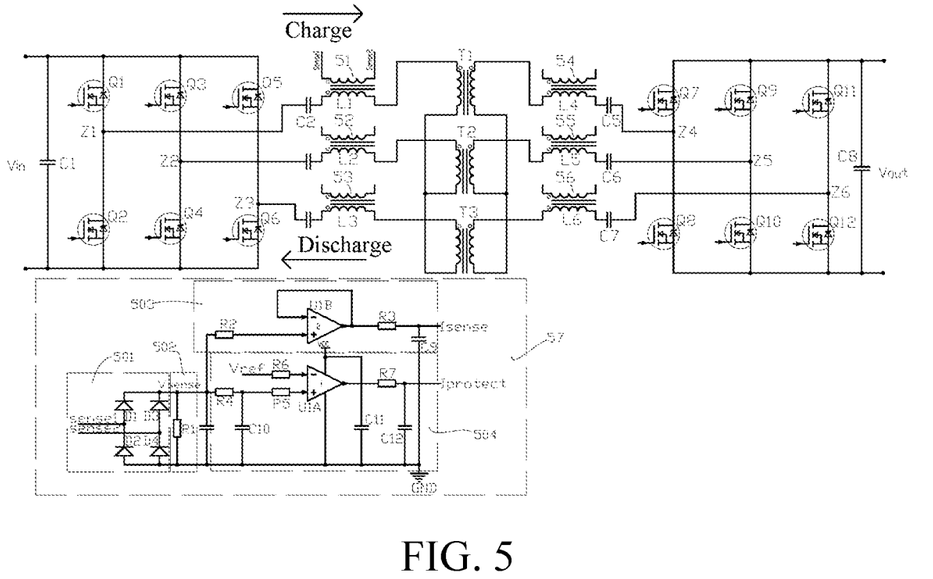
FIG. 5 is a schematic diagram of a circuit topology of a DC-DC converter according to an embodiment of the present disclosure.

In some embodiments of the present disclosure, as shown in FIG. 5, the first three-phase bridge circuit 10 includes a first one-phase bridge arm, a first two-phase bridge arm, and a first three-phase bridge arm. The first one-phase bridge arm includes a first switch tube Q1 and a second switch tube Q2, where one end of the first switch tube Q1 is connected to one end of the second switch tube Q2, and there is a first phase line connection point Z1 between one end of the first switch tube Q1 and one end of the second switch tube Q2. The first two-phase bridge arm includes a third switch tube Q3 and a fourth switch tube Q4, where one end of the third switch tube Q3 is connected to one end of the fourth switch tube Q4, and there is a second phase line connection point Z2 between one end of the third switch tube Q3 and one end of the fourth switch tube Q4. The first three-phase bridge arm includes a fifth switch tube Q5 and a sixth switch tube Q6, where one end of the fifth switch tube Q5 is connected to one end of the sixth switch tube Q6, and there is a third phase line connection point Z3 between one end of the fifth switch tube Q5 and one end of the sixth switch tube Q6. The other end of the first switch tube Q1, the other end of the third switch tube Q3, and the other end of the fifth switch tube Q5 are connected together to form a first end point S11 of the first three-phase bridge circuit, and the other end of the second switch tube Q2, the other end of the fourth switch tube Q4, and the other end of the sixth switch tube Q6 are connected together to form a second end point S12 of the first three-phase bridge circuit 10. The first end point S11 and the second end point S12 may be connected to other modules for input or output.

As shown in FIG. 5, the first three-phase bridge circuit 10 further includes a first capacitor C1, where one end of the first capacitor C1 is connected to the first end point S11 of the first three-phase bridge circuit 10, and the other end of the first capacitor C1 is connected to the second end point S12 of the first three-phase bridge circuit 10, and may filter an output or an input of the first three-phase bridge circuit 10.

As shown in FIG. 5, the three primary LC units 21 include a first primary LC unit, a second primary LC unit, and a third primary LC unit. The first primary LC unit includes a second capacitor C2 and a first inductor L1, where one end of the second capacitor C2 is connected to the first phase line connection point Z1, the other end of the second capacitor C2 is connected to one end of the first inductor L1, and the other end of the first inductor L1 is connected to dotted terminals of primary coils of a corresponding phase voltage transformation unit 22. The second primary LC unit includes a third capacitor C3 and a second inductor L2, where one end of the third capacitor C3 is connected to the second phase line connection point Z2, the other end of the third capacitor C3 is connected to one end of the second inductor L2, and the other end of the second inductor L2 is connected to dotted terminals of primary coils of a corresponding phase voltage transformation unit 22. The third primary LC unit includes a fourth capacitor C4 and a third inductor L3, where one end of the fourth capacitor C4 is connected to the third phase line connection point Z3, the other end of the fourth capacitor C4 is connected to one end of the third inductor L3, and the other end of the third inductor L3 is connected to dotted terminals of primary coils of a corresponding phase voltage transformation unit 22.

In the embodiment of the present disclosure, as shown in FIG. 5, the three-phase voltage transformation unit 22 includes a first phase voltage transformation unit T1, a second phase voltage transformation unit T2, and a third phase voltage transformation unit T3.

The first phase voltage transformation unit T1 includes a first primary coil and a first secondary coil, where dotted terminals of the first primary coil are connected to the other end of the first inductor L1, and dotted terminals of the first secondary coil are connected to one end of a corresponding secondary LC unit 23. The second phase voltage transformation unit T2 includes a second primary coil and a second secondary coil, where dotted terminals of the second primary coil are connected to the other end of the second inductor L2, and dotted terminals of the second secondary coil are connected to one end of a corresponding secondary LC unit 23. The third phase voltage transformation unit T3 includes a third primary coil and a third secondary coil, where dotted terminals of the third primary coil are connected to the other end of the third inductor L3, and dotted terminals of the third secondary coil is connected to one end of a corresponding secondary LC unit 23. Undotted terminals of the first primary coil, undotted terminals of the second primary coil, and undotted terminals of the third primary coil are connected together, for example, are connected to an NP, to form a Y-type connection. Undotted terminals of the first secondary coil, undotted terminals of the second secondary coils, and undotted terminals of the third secondary coils are connected together, for example, are connected to an NS, to form a Y-type connection. The Y-type connection may help the three-phase bridge circuit to implement automatic current sharing, thereby avoiding uneven power distribution caused by a device parameter deviation of the three-phase bridge circuit.

As shown in FIG. 5, the second three-phase bridge circuit 30 includes a second one-phase bridge arm, a second two-phase bridge arm, and a second three-phase bridge arm.

The second one-phase bridge arm includes a seventh switch tube Q7 and an eighth switch tube Q8, where one end of the seventh switch tube Q7 is connected to one end of the eighth switch tube Q8, and there is a fourth phase line connection point Z4 between one end of the seventh switch tube Q7 and one end of the eighth switch tube Q8. The second two-phase bridge arm includes a ninth switch tube Q9 and a tenth switch tube Q10, where one end of the ninth switch tube Q9 is connected to one end of the tenth switch tube Q10, and there is a fifth phase line connection point Z5 between one end of the ninth switch tube Q9 and one end of the tenth switch tube Q10. The second three-phase bridge arm includes an eleventh switch tube Q11 and a twelfth switch tube Q12, where one end of the eleventh switch tube Q11 is connected to one end of the twelfth switch tube Q12, and there is a sixth phase line connection point Z6 between one end of the eleventh switch tube Q11 and one end of the twelfth switch tube Q12. The other end of the seventh switch tube Q7, the other end of the ninth switch tube Q9, and the other end of the eleventh switch tube Q11 are connected together to form a first end point S21 of the second three-phase bridge circuit 30. The other end of the eighth switch tube Q8, the other end of the tenth switch tube Q10, and the other end of the twelfth switch tube Q12 are connected together to form a second end point S22 of the second three-phase bridge circuit 30. The first end point S21 and the second end point S22 may be connected to other modules for input or output.

As shown in FIG. 5, the second three-phase bridge circuit 30 further includes a fifth capacitor C5, where one end of the fifth capacitor C5 is connected to the first end point S21 of the second three-phase bridge circuit 30, and the other end of the fifth capacitor C5 is connected to the second end point S22 of the second three-phase bridge circuit 30. The fifth capacitor C5 may filter an output or an input of the second three-phase bridge circuit 30.

In some embodiments of the present disclosure, as shown in FIG. 5, the three secondary LC units 23 include a first secondary LC unit, a second secondary LC unit, and a third secondary LC unit.

The first secondary LC unit includes a fourth inductor L4 and a sixth capacitor C6, where one end of the fourth inductor L4 is connected to the dotted terminals of the first secondary coil, the other end of the fourth inductor L4 is connected to one end of the sixth capacitor C6, and the other end of the sixth capacitor C6 is connected to the fourth phase line connection point Z4. The second secondary LC unit includes a fifth capacitor L5 and a seventh capacitor C7, where one end of the fifth capacitor L5 is connected to the dotted terminals of the second secondary coil, the other end of the fifth inductor L5 is connected to one end of the seventh capacitor C7, and the other end of the seventh capacitor C7 is connected to the fifth phase line connection point Z5. The third secondary LC unit includes a sixth inductor L6 and an eighth capacitor C8, where one end of the sixth inductor L6 is connected to the dotted terminals of the third secondary coil, the other end of the sixth inductor L6 is connected to one end of the eighth capacitor C8, and the other end of the eighth capacitor C8 is connected to the sixth phase line connection point Z6.

In some embodiments, the first three-phase bridge circuit 10 is connected to a charging input, and the second three-phase bridge circuit 30 is connected to the battery module of the electric vehicle. For forward charging, the second capacitor C2, the first inductor L1, and the first primary coil form a resonant cavity of the first one-phase bridge arm; the third capacitor C3, the second inductor L2, and the second primary coil form a resonant cavity of the first two-phase bridge arm; and the fourth capacitor C4, the third capacitor L3, and the third primary coil form a resonant cavity of the first three-phase bridge arm. In some embodiments, the second capacitor C2, the third capacitor C3, and the fourth capacitor C4 are referred to as primary resonant capacitors, and the first inductor L1, the second inductor L2, and the third inductor L3 are referred to as primary resonant inductors.

When the battery module is charged by the external, each phase bridge arm of the first three-phase bridge arm circuit 10 and the corresponding resonance module form three-phase interleaved LLC that works in a high-frequency resonant state. The controller 40 controls the first switch tube Q1, the second switch tube Q2, the third switch tube Q3, the fourth switch tube Q4, the fifth switch tube Q5, and the sixth switch tube Q6 to turn on/off alternately at a duty ratio of 50%; controls the first switch tube Q1, the third switch tube Q3, and the fifth switch tube Q5 to turn on/off with a mutual phase difference of 120°; controls the second switch tube Q2, the fourth switch tube Q4, and the sixth switch tube Q6 to turn on/off with a mutual phase difference of 120°; and performs rectification control on the second three-phase bridge circuit 30. The second three-phase bridge circuit 30 is used as a secondary three-phase rectifier bridge, and a high-frequency current is converted into a direct current after being rectified by a diode in a switch tube body of the second three-phase bridge circuit 30, and the direct current is provided for a high-voltage battery module of the whole vehicle. Generally, as shown in FIG. 5, each switch tube includes a diode element, which may be referred to as a switch tube diode. If a drive signal is transmitted to the switch tubes of the second three-phase bridge circuit 30, the second three-phase bridge circuit 30 forms a synchronous rectification circuit, thereby further improving product efficiency.

In some embodiments, the first three-phase bridge circuit 10 is connected to an electricity consumption side, and the second three-phase bridge circuit 30 is connected to the battery module of the electric vehicle. For backward discharge, the sixth capacitor C6, the fourth inductor L4, and the first secondary coil form a resonant cavity of the second one-phase bridge arm; the seventh capacitor C7, the fifth inductor L5, and the second secondary coil form a resonant cavity of the second two-phase bridge arm; and the eighth capacitor C8, the sixth inductor L6, and the third secondary coil form a resonant cavity of the second three-phase bridge arm. In some embodiments, the sixth capacitor C6, the seventh capacitor C7, and the eighth capacitor C8 are referred to as secondary resonant capacitors, and the fourth inductor L4, the fifth inductor L5, and the sixth inductor L6 are referred to as secondary resonant inductors.

When the battery module is discharged by the external, each phase bridge arm of the second three-phase bridge circuit 30 and the corresponding resonance module form three-phase interleaved LLC that works in a high-frequency resonant state. The controller 40 controls the seventh switch tube Q7, the eighth switch tube Q8, the ninth switch tube Q9, the tenth switch tube Q10, the eleventh switch tube Q11, and the twelfth switch tube Q12 to turn on/off alternately at a duty ratio of 50%; controls the seventh switch tube Q7, the ninth the switch tube Q9, and the eleventh switch tube Q11 to turn on/off at a mutual phase difference of 120°; controls the eighth switch tube Q8, the tenth switch tube Q10, and the twelfth switch tube Q12 to turn on/off at a mutual phase difference of 120°; and performs rectification control on the first three-phase bridge circuit 10. The first three-phase bridge circuit 30 is used as a discharge output three-phase rectifier bridge. A high-frequency current is converted into a direct current after being rectified by a diode in a switch tube body of the first three-phase bridge circuit 30, and the direct current is provided for a module at the electricity consumption output side. If a drive signal is transmitted to the switch tubes of the first three-phase bridge circuit 10, the first three-phase bridge circuit 10 forms a synchronous rectification circuit, thereby further improving the product efficiency.

Figure 6:
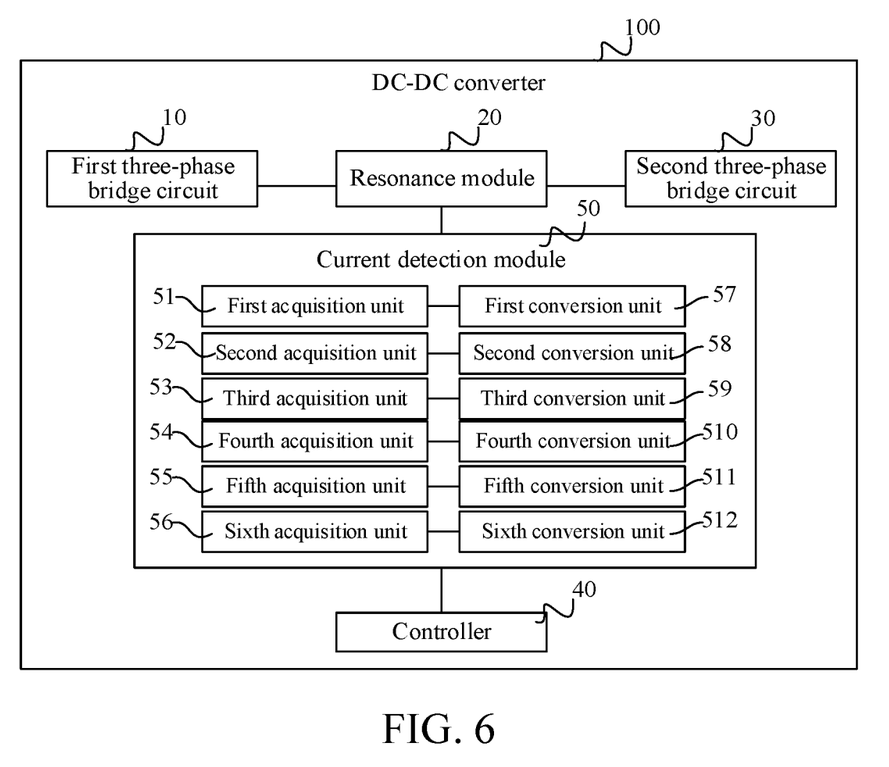
FIG. 6 is a block diagram of a DC-DC converter according to an embodiment of the present disclosure.

FIG. 6 is a block diagram of a DC-DC converter according to an embodiment of the present disclosure. The current detection circuit 50 according to the embodiment of the present disclosure includes a first acquisition unit 51, a second acquisition unit 52, a third acquisition unit 53, a fourth acquisition unit 54, a fifth acquisition unit 55, and a sixth acquisition unit 56. The first acquisition unit 51 is configured to acquire a current signal of the first inductor L1; the second acquisition unit 52 is configured to acquire a current signal of the second inductor L2; the third acquisition unit 53 is configured to acquire a current signal of the third inductor L3; the fourth acquisition unit 54 is configured to acquire a current signal of the fourth inductor L4; the fifth acquisition unit 55 is configured to acquire a current signal of the fifth inductor L5; and the sixth acquisition unit 56 is configured to acquire a current signal of the sixth inductor L6. By separately performing current detection on the inductors of the resonance module 20, the current of the resonant cavity can be more effectively monitored, and the power of the three-phase bridge circuit can be further adjusted, so that the power of the three-phase bridge is more balanced.

The current detection circuit 50 according to the embodiment of the present disclosure further includes N conversion units, where an $N^{th}$ conversion unit is connected to an $N^{th}$ acquisition unit, the $N^{th}$ conversion unit is configured to convert a current signal acquired by the $N^{th}$ acquisition unit, and N=1, 2, 3 . . . 6. For example, as shown in FIG. 6, a first conversion unit 57, a second conversion unit 58, a third conversion unit 59, a fourth conversion unit 510, a fifth conversion unit 511 and a sixth conversion unit 512 are included. The first conversion unit 57 is configured to convert the current signal of the first inductor L1; the second conversion unit 58 is configured to convert the current signal of the second inductor L2; the third conversion unit 59 is configured to convert the current signal of the third inductor L3; the fourth conversion unit 510 is configured to convert the current signal of the fourth inductor L4; the fifth conversion unit 511 is configured to convert the current signal of the fifth inductor L5; and the sixth conversion unit 512 is configured to convert the current signal of the sixth inductor L6, so that the current signal of each circuit is converted into a signal that can be recognized and processed by the controller 40.

In some embodiments, the first acquisition unit 51, the second acquisition unit 52, the third acquisition unit 53, the fourth acquisition unit 54, the fifth acquisition unit 55, and the sixth acquisition unit 56 are each a coupled inductor or a current transformer. The coupled inductor has induction with each resonant inductor, to generate a high-frequency alternating current signal, so that the current signal of each resonant inductor is detected. The coupled inductor is an auxiliary coupled coil of the resonant inductor. With the coupled inductor, it is unnecessary to add a current detection device additionally, and other related resistors, capacitors and operational amplifiers are all common components, so that costs of the system are barely increased. The current transformer may be an independent external device. According to the detection principle of the current transformer, a main side coil of the current transformer and the resonant inductor are connected in series in the circuit, and the current signal of the resonant inductor is detected through mutual inductance of a secondary side coil and the main side coil of the current transformer.

In some embodiments of the present disclosure, referring to FIG. 5, only one conversion unit is shown in the figure, and other conversion units are the same. In this embodiment, the $N^{th}$ conversion circuit includes an $N^{th}$ rectifier circuit 501, an $N^{th}$ voltage conversion circuit 502, and an $N^{th}$ voltage follower circuit 503. The $N^{th}$ rectifier circuit 501 is configured to rectify the current signal acquired by the $N^{th}$ acquisition unit, to obtain a rectified signal; the $N^{th}$ voltage conversion circuit 502 is configured to convert the rectified signal into a voltage signal; and the $N^{th}$ voltage follower circuit 503 is configured to convert the voltage signal into an AD signal. The controller 40 is configured to: control the switch tubes of the first three-phase bridge circuit 10 and the second three-phase bridge circuit 30 when the AD signal is greater than a preset AD value, and reduce the output power when the AD value exceeds the standard, to reduce the working current of the system to avoid overloading in the phase.

When the battery module is charged by the external, if an overcurrent occurs, the controller 40 controls duty ratios of the switch tubes of the first one-phase bridge arm, the switch tubes of the first two-phase bridge arm, and the switch tubes of the first three-phase bridge arm to be reduced to reduce the output power; alternatively, when the battery module is discharged by the external, if an overcurrent occurs, the controller 40 reduces duty ratios of the switch tubes of the second one-phase bridge arm, the switch tubes of the second two-phase bridge arm, and the switch tubes of the second three-phase bridge arm to reduce the output power. By reducing the output power, the working current of the system is reduced to avoid overloading, and avoid affecting the service life of the product and even an earlier-than-expected damage due to the large impact current of the resonant cavity.

Referring to FIG. 5, the $N^{th}$ rectifier circuit 501 includes a first diode D1, a second diode D2, a third diode D3, and a fourth diode D4. One end of the first diode D1 is connected to one end of the second diode D2, there is a first input node between one end of the first diode D1 and one end of the second diode D2, and the first input node is connected to a first output end of a corresponding acquisition unit, for example, the acquisition unit in the figure outputs a signal sense1. One end of the third diode D2 is connected to one end of the fourth diode D4, there is a second input node between one end of the third diode D3 and one end of the fourth diode D4, and the second input node is connected to a second output end of a corresponding acquisition unit, for example, the acquisition unit in the figure outputs a signal sense2. The other end of the first diode D1 and the other end of the third diode D3 are connected together to form a first rectifier output end. The other end of the second diode D2 and the other end of the fourth diode D4 are connected together and are connected to a ground end. The $N^{th}$ voltage conversion circuit 502 includes a first resistor R1, where one end of the first resistor R1 is connected to the first rectifier output end, for example, a signal Vsense is outputted, and the other end of the first resistor R1 is connected to the ground end. The $N^{th}$ voltage follower circuit 503 includes a second resistor R2, a voltage follower U1B, a third resistor R3, and a ninth capacitor C9. One end of the second resistor R2 is connected to one end of the first resistor R1, a positive input end of the voltage follower U1B is connected to the other end of the second resistor R2, an output end of the voltage follower U1B is connected to one end of the third resistor R3, the output end of the voltage follower U1B is connected to a negative input end of the voltage follower U1B, the other end of the third resistor R3 is connected to the controller 40, for example, an AD signal Isense is outputted to the controller 40, one end of the ninth capacitor C9 is connected between the third resistor R3 and the controller 40, and the other end of the ninth capacitor C9 is connected to the ground end. The controller 40 adjusts the system power according to the AD signal. Certainly, the circuit may be adaptively deformed as required. For example, a capacitor is added to perform filtering processing, or resistors in parallel or in series may be used to perform voltage conversion or acquisition. FIG. 5 merely shows an exemplary circuit.

The first primary LC unit is used as an example. After being transmitted to the rectifier circuit and the first resistor R1, a high-frequency alternating-current signal sensed by the coupled inductor 51 of the first inductor L1 is converted into a high-frequency half-wave voltage signal Vsense. The voltage signal Vsense becomes the AD signal Isense through the voltage follower U1B, and is transmitted to the controller 40. If detecting that the AD signal exceeds the standard, the controller 40 reduces the output power, to reduce the system working current to avoid damage caused by overloading in the phase.

In some embodiments of the present disclosure, FIG. 5 only shows a conversion unit. In this embodiment, the $N^{th}$ conversion unit further includes an $N^{th}$ comparison circuit 504. That is, each conversion unit includes a respective comparison circuit. The $N^{th}$ comparison circuit 504 is configured to output a stop signal to the controller 40 when the current signal is greater than a jump threshold. The controller 40 turns off driving of the switch tubes of the first three-phase bridge circuit 10 and the second three-phase bridge circuit 30 when the stop signal is detected.

Referring to FIG. 5, the $N^{th}$ comparison circuit 504 includes a fifth resistor R4, a fifth resistor R5, a tenth capacitor C10, a comparator U1A, an eleventh capacitor C11, and a twelfth capacitor C12. One end of the fourth resistor R4 is connected to one end of the first resistor R1. For example, the voltage signal Vsense outputted by the voltage conversion circuit 502 is inputted to the comparison circuit 504. The other end of the fourth resistor R4 is connected to one end of the fifth resistor R5. One end of the tenth capacitor C10 is connected between the other end of the fourth resistor R4 and one end of the fifth resistor R5. A first input end of the comparator U1A is connected to the other end of the fifth resistor R5, a second input end of the comparator U1A is connected to a reference voltage input end by using a sixth resistor R6, a third end of the comparator U1A is connected to the ground end, a fourth end of the comparator U1A is connected to a preset power supply, and an output end of the comparator U1A is connected to the controller 40 by using a seventh resistor R7, for example, a protection signal Iprotect is outputted to the controller 40. One end of the eleventh capacitor C11 is separately connected to the fourth end of the comparator U1A and the preset power supply, and the other end of the eleventh capacitor C11 is connected to the ground end. One end of the twelfth capacitor C12 is connected between the seventh resistor R7 and the controller 40, and the other end of the twelfth capacitor C12 is connected to the ground end.

The first primary LC unit is used as an example. The voltage signal Vsense is transmitted to the comparison circuit 504, and a hardware high low-level signal is outputted through the comparator U1A. When the U1A outputs a high level, it indicates that the current of the resonant cavity has severely exceeded the standard. After the high-level signal is detected, the controller 40 immediately turns off driving of the switches, and the system stops working, to avoid damaging the converter.

In summary, compared with calculating the current of the resonant cavity through output current sampling, the DC-DC converter according to the embodiment of the present disclosure forms a current transformer through the auxiliary coupled inductor of the resonant inductor or is provided with an independent external current transformer, directly acquires the current signal of the resonant cavity, and performs control and protection according to the current signal.

Figure 7:
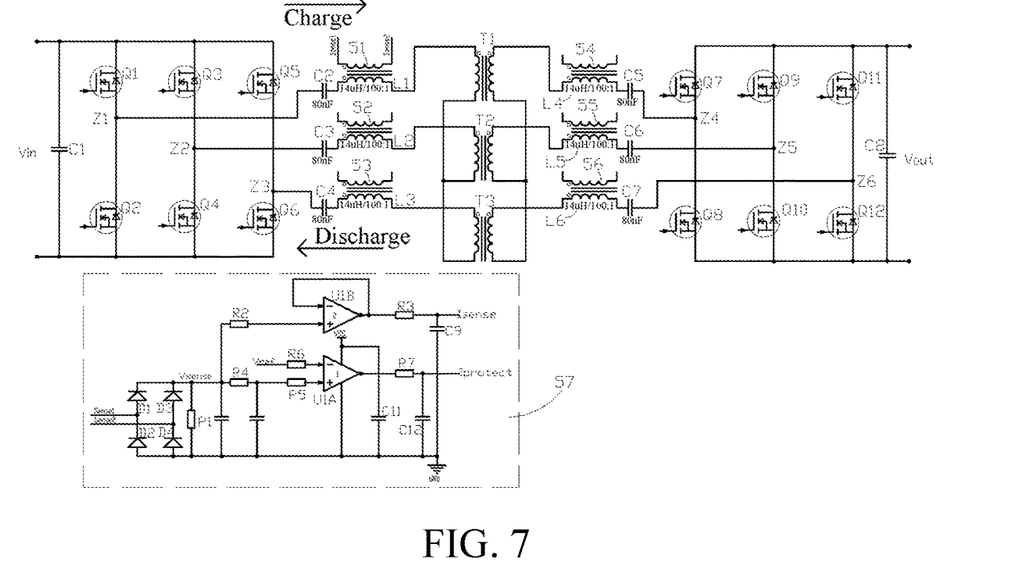
FIG. 7 is a schematic diagram of a circuit topology of a DC-DC converter according to an embodiment of the present disclosure.

A 20-KW three-phase interleaved LLC bidirectional DC-DC converter is used as an example for description below. As shown in FIG. 7, each acquisition unit is a coupled inductor of a resonant inductor, and design requirements are as follows: rated values of the input voltage and the output voltage of the DC-DC converter are both 750 V, and full-load powers in the charging direction and the discharging direction are both 20 KW. For parameter settings of the resonant cavities, because the forward charging voltages and powers are equal, the resonant cavity corresponding to the first three-phase bridge circuit 10, for example, referred to as the primary resonant cavity, and the resonant cavity corresponding to the second three-phase bridge circuit 30, for example, referred to as the secondary resonant cavity, have the same parameters. It is assumed that the resonant frequency of the circuit is 150 KHZ, and it can be obtained according to the relevant calculation formula of the three-phase interleaved LLC circuit that: primary resonant capacitance C2=C3=C4=secondary resonant capacitance C5=C6=C7=80 nF, primary resonant inductance L1=L2=L3=secondary resonant inductance L4=L5=L6=14 µH, a turn ratio of the coupled inductor to the resonant inductor is 100:1, a turn ratio of the three-phase voltage transformation unit 22 T1=T2=T3=1:1, and inductance of the primary coils of the three-phase voltage transformation unit 22 $T_{1-1}=T_{2-1}=T_{3-1}$=inductance of the secondary coils=$T_{1-2}=T_{2-2}=T_{3-2}$=70 µH. According to consideration on the current and voltage requirements, heat dissipation requirements and the like, the switch tubes Q1 to Q12 are 1200 V/40 mΩ silicon carbide metal oxide semiconductor (MOS) transistors. For details, refer to FIG. 7.

The first primary LC unit is used as an example, and other resonant inductors can be obtained based on the same circuit principle. If the current flowing through the first inductor L1 is Ir, an inductance-limited current of the coupled inductor of the resonant inductor is Ir/100, and a peak level Vsense (peak) after the resistor R1=1.414*Ir/10. After Vsense passes through the voltage follower U1B and is filtered by the RC, the AD signal Isense is outputted to the controller 40; Vref is a hardware protection reference voltage, and if the protection is triggered when the Ir peak current is greater than 30 A, Vref=3 V.

Figure 8:
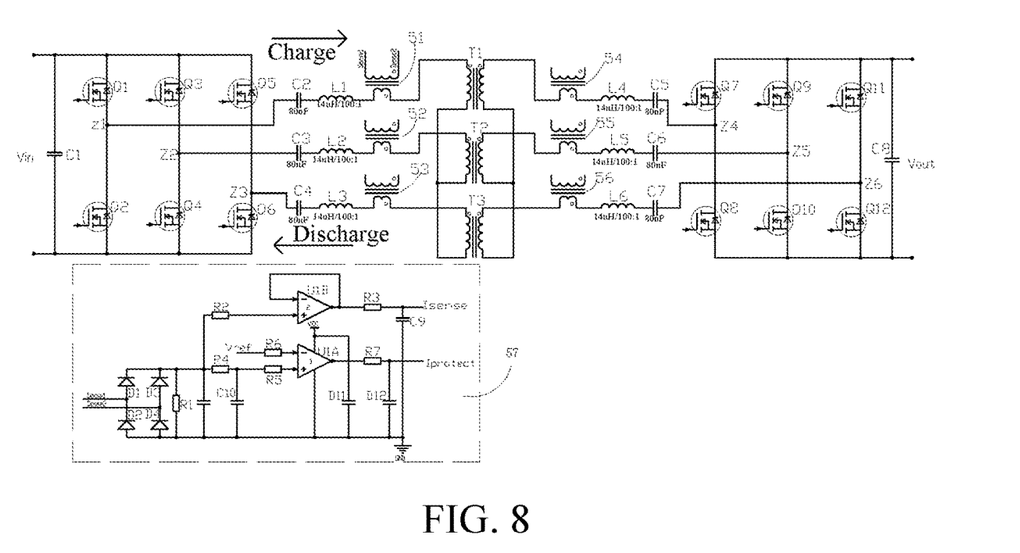
FIG. 8 is a schematic diagram of a circuit topology of a DC-DC converter according to another embodiment of the present disclosure.

FIG. 8 is a circuit diagram of a 20-KW three-phase interleaved LLC bidirectional DC-DC converter according to another embodiment of the present disclosure. As shown in FIG. 8, each acquisition unit is an independent peripheral current transformer, and design requirements are as follows: rated values of the input voltage and the output voltage of the DC-DC converter are both 750 V, and full-load powers in the charging direction and the discharging direction are both 20 KW. For parameter settings of the resonant cavities, because the forward charging voltages and powers are equal, the resonant cavity corresponding to the first three-phase bridge circuit 10, for example, referred to as the primary resonant cavity, and the resonant cavity corresponding to the second three-phase bridge circuit 30, for example, referred to as the secondary resonant cavity, have the same parameters. It is assumed that the resonant frequency of the circuit is 150 KHZ, and it can be obtained according to the relevant calculation formula of the three-phase interleaved LLC circuit that: primary resonant capacitance C2=C3=C4=secondary resonant capacitance C5=C6=C7=80 nF, primary resonant inductance L1=L2=L3=secondary resonant inductance L4=L5=L6=14 µH, a turn ratio of the coupled inductor to the resonant inductor is 100:1, a turn ratio of the three-phase voltage transformation unit 22 T1=T2=T3=1:1, and inductance of the primary coils of the three-phase voltage transformation unit 22 $T_{1-1}=T_{2-1}=T_{3-1}$=inductance of the secondary coils=$T_{1-2}=T_{2-2}=T_{3-2}$=70 µH. According to consideration on the current and voltage requirements, heat dissipation requirements and the like, the switch tubes Q1 to Q12 are 1200 V/40 mΩ silicon MOS transistors. For details, refer to FIG. 8.

The first primary LC unit is still used as an example, and other resonant inductors can be obtained based on the same circuit principle. If the current flowing through the first inductor L1 is Ir, an inductance-limited current of the coupled inductor of the resonant inductor is Ir/100, and a peak level Vsense (peak) after the resistor R1=1.414*Ir/10. After Vsense passes through the voltage follower U1B and is filtered by the RC, the AD signal Isense is outputted to the controller 40; Vref is a hardware protection reference voltage, and if the protection is triggered when the Ir peak current is greater than 30 A, Vref=3 V.

Compared with the common three-phase full-bridge DC-DC converter, the DC-DC converter 100 according to the embodiment of the present disclosure adds three resonant units at a transformer secondary side, and the second three-phase bridge circuit 30 uses a controllable switch tube. The bidirectional resonance can implement bidirectional transmission of energy, and the transmission in both directions works in a soft switch mode. The three-phase interleaved LLC is formed, which can implement higher power conversion, and compared with the common three-phase interleaved LLC, fewer power switch tubes are used. In addition, the three-phase voltage transformation unit 22 can implement automatic current sharing of the three-phase bridge circuit by adopting the Y-type connection method, to avoid uneven power distribution. Based on the circuit structure of the DC-DC converter 100 according to the embodiments of the present disclosure, the output ripple current is smaller, and the smaller ripple current can reduce output filter capacitors, thereby helping reduce the costs and reduce the product volume.

In addition, in the DC-DC converter 100 according to the embodiments of the present disclosure, a coupled inductor is added to each resonant inductor. In this case, the resonant inductor not only has a function of interleaved resonance, but also forms a current transformer with the coupled inductor, to detect the current signal of the resonant inductor without additionally adding a current detection device, so that the costs are low. Alternatively, an independent current transformer is added to each resonant inductor to detect the current signal of the resonant inductor. Direct acquisition of the current signal of the resonant inductor achieves a high precision and a faster feedback response. Moreover, the use of software and hardware double protection achieves high reliability. The current signal of the resonant cavity is transmitted to an AD sampling port of the controller 40 after being processed, and the controller 40 adjusts the system power according to the AD value. In addition, when the resonant cavity has a severe overcurrent, an overcurrent lock protection signal is directly outputted after the current signal of the resonant cavity triggers a hardware fast comparator, and the controller 40 directly turns off driving of the three-phase bridge switch tube after the overcurrent lock protection signal is detected, to avoid system damage. Through the software and hardware double protection, the overcurrent protection function is fast and stable.

Based on the DC-DC converter according to the embodiment of the foregoing aspect, the on-board charger according to an embodiment of the present disclosure is described below with reference to the accompanying drawings.

Figure 9:
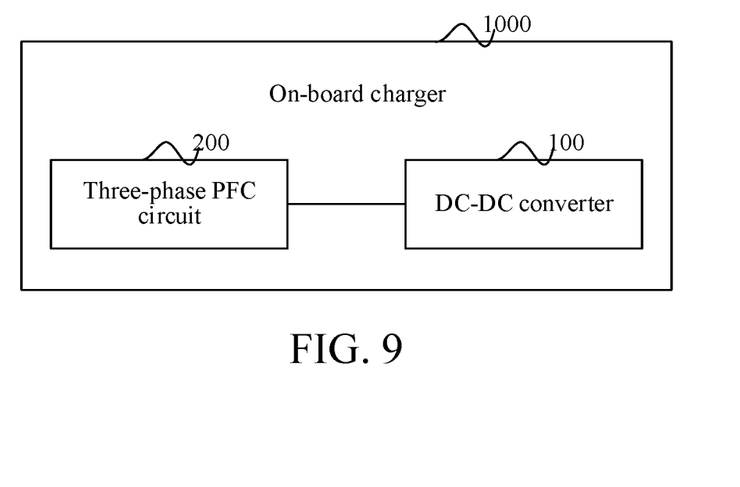
FIG. 9 is a block diagram of an on-board charger according to an embodiment of the present disclosure.

FIG. 9 is a block diagram of an on-board charger according to an embodiment of the present disclosure. As shown in FIG. 9, the on-board charger 1000 according to the embodiment of the present disclosure includes a three-phase PFC circuit 200 and the DC-DC converter 100 according to the foregoing embodiments. The three-phase PFC circuit 200 plays a role of correcting a power factor, and the DC-DC converter 100 implements a controllable isolated transmission of energy. For a specific structure and working process of the DC-DC converter 100, refer to the description in the foregoing embodiments.

According to the embodiment of the present disclosure, by adopting the DC-DC converter 100 according to the embodiment of the foregoing aspect, the on-board charger 1000 can implement high-power charging and discharging, has a small output ripple current, and a fast and reliable overcurrent protection function.

Figure 10:
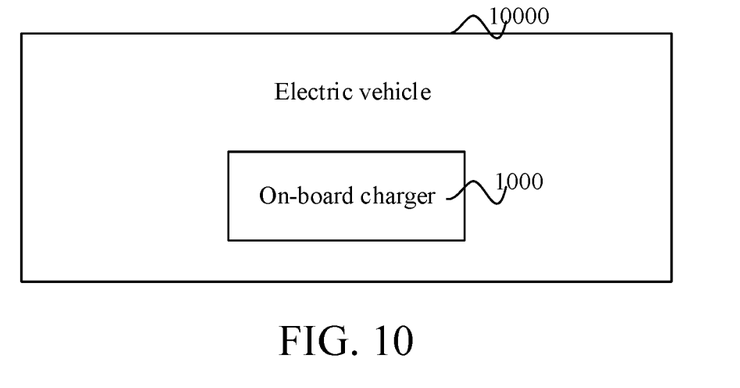
FIG. 10 is a block diagram of an electric vehicle according to an embodiment of the present disclosure.

FIG. 10 is a block diagram of an electric vehicle according to an embodiment of the present disclosure. As shown in FIG. 10, the electric vehicle 10000 according to the embodiment of the present disclosure includes the on-board charger 1000 according to the embodiment of the foregoing aspect.

According to the embodiment of the present disclosure, by mounting the on-board charger 1000 according to the embodiment of the foregoing aspect, the electric vehicle 10000 can implement high-power charging and discharging, and has a small output ripple current, and a fast and reliable overcurrent protection function.

In the descriptions of this specification, descriptions using reference terms "an embodiment", "some embodiments", "an example", "a specific example", or "some examples" mean that specific characteristics, structures, materials, or features described with reference to the embodiment or example are included in at least one embodiment or example of the present disclosure. In this specification, exemplary descriptions of the terms are not necessarily directed to the same embodiment or example. In addition, the described specific characteristics, structures, materials, or features may be combined in an appropriate manner in any one or more embodiments or examples. In addition, with no conflict, a person skilled in the art can combine or group different embodiments or examples that are described in this specification and characteristics of the different embodiments or examples.

Although the embodiments of the present disclosure are shown and described above, it can be understood that, the foregoing embodiments are exemplary, and cannot be construed as a limitation to the present disclosure. A person of ordinary skill in the art may make changes, modifications, replacements, and variations to the foregoing embodiments within the scope of the present disclosure.

What is claimed is:

1. A DC-DC converter, comprising:
a first adjustment module, a resonance module, a second adjustment module, a current detection module and a controller, wherein:
the first adjustment module is configured to: adjust frequency of an input signal of the DC-DC converter when a battery module of a vehicle is charged by an external power supply, and rectify an output signal of the resonance module when the battery module is discharged by the external power supply;
the resonance module is configured to: resonate an output signal of the first adjustment module when the battery module of the vehicle is charged by the external power supply, and resonate an output signal of the second adjustment module when the battery module is discharged by the external power supply;
the second adjustment module is configured to: adjust frequency of an output signal of the battery module when the battery module of the vehicle is discharged by the external power supply, and rectify the output signal of the resonance module when the battery module is charged by the external power supply;
the current detection module is configured to detect a current signal of the resonance module; and
the controller, separately connected to a control end of the first adjustment module and a control end of the second adjustment module, is configured to control the first adjustment module and the second adjustment module when the current signal is greater than a current threshold, to reduce an output power.

2. The DC-DC converter according to claim 1, wherein the resonance module comprises N primary LC circuits, an N-phase voltage transformation unit, and N secondary LC circuits, and N is a positive integer greater than 1.

3. The DC-DC converter according to claim 1, wherein:
the resonance module comprises three primary LC circuits, a three-phase voltage transformation unit, and three secondary LC circuits;

when the DC-DC converter charges the battery module, the three primary LC circuits and the three-phase voltage transformation unit are configured to resonate the output signal of the first adjustment module to generate a high-frequency current; and when the DC-DC converter discharges the battery module, the three secondary LC circuits and the three-phase voltage transformation unit are configured to resonate the output signal of the second adjustment module to generate a high-frequency current.

4. The DC-DC converter according to claim 3, wherein:

the first adjustment module comprises a first three-phase bridge circuit;

the second adjustment module comprises a second three-phase bridge circuit;

one end of each primary LC circuit is connected to a phase line connection point of a corresponding phase bridge arm in the first three-phase bridge circuit;

dotted terminals of primary coils of the three-phase voltage transformation unit are separately connected to the other ends of the corresponding primary LC circuits;

undotted terminals of the primary coils of the three-phase voltage transformation unit are connected together;

dotted terminals of secondary coils of the three-phase voltage transformation unit are separately connected to one ends of the corresponding secondary LC circuits;

undotted terminals of the secondary coils of the three-phase voltage transformation unit are connected together;

a phase line connection point of each phase bridge arm of the second three-phase bridge circuit is connected to the other end of a corresponding secondary LC circuit; and the controller is separately connected to a control end of a switch tube of the first three-phase bridge circuit and a control end of a switch tube of the second three-phase bridge circuit.

* * * * *